United States Patent [19]
Fujimori

[11] 4,234,646
[45] Nov. 18, 1980

[54] ENGRAVING BOARD FOR PRINT-PRODUCTION

[75] Inventor: Sadao Fujimori, Tokyo, Japan

[73] Assignee: Tokyo Shobundo & Co., Ltd., Japan

[21] Appl. No.: 49,979

[22] Filed: Jun. 19, 1979

Related U.S. Application Data

[63] Continuation of Ser. No. 842,339, Oct. 14, 1977, abandoned.

[30] Foreign Application Priority Data

Aug. 23, 1977 [JP] Japan ................... 52-112709

[51] Int. Cl.³ .................... B32B 7/02; B32B 29/02; B41F 9/02
[52] U.S. Cl. .................... 428/215; 101/150; 101/151; 428/211; 428/216; 428/218; 428/284; 428/535; 428/908
[58] Field of Search .............. 101/128.2, 150, 170, 101/379, 395, 401.1, 151; 428/196, 211, 212, 213, 288, 535, 908, 909, 215, 216, 218, 284

[56] References Cited

U.S. PATENT DOCUMENTS

| 1,810,089 | 6/1931 | Schmutz | 101/379 X |
| 1,941,148 | 12/1933 | Keltie | 101/379 X |
| 2,100,358 | 11/1937 | Royse et al. | 101/395 X |
| 2,358,189 | 9/1944 | Sprigg et al. | 101/379 |
| 3,186,894 | 6/1965 | Liles et al. | 428/908 X |

Primary Examiner—Bruce H. Hess
Attorney, Agent, or Firm—McGlew and Tuttle

[57] ABSTRACT

An engraving board for printing a design with coloring media comprising, a first or thick paper layer with a second or thinner paper layer overlaying the thick paper layer and secured thereto. A printing layer comprising a multiplicity of densely packed short fibers overlays the thin paper layer and is secured thereto. The three layers can be secured to each other by means of water resistant adhesive and both the thinner and thick paper layers can comprise water absorbent material so that when a design is impressed upon the printing layer, exposing a portion of the thin paper layer, the coloring medium which is applied over the engraving board is absorbed into a thinner paper layer leaving the coloring medium on the remaining printing layer only to be used in printing the design.

9 Claims, 7 Drawing Figures

ENGRAVING BOARD FOR PRINT-PRODUCTION

CROSS REFERENCE TO RELATED APPLICATIONS

The present application is a continuation in part of the inventor's previous and co-pending application having Ser. No. 842,339 filed Oct. 14th, 1977 now abandoned.

FIELD AND BACKGROUND OF THE INVENTION

The present invention reltes in general to an engraving board and, in particular, to a new and novel engraving board for producing a print, composed of a plurality of layers of materials.

DESCRIPTION OF THE PRIOR ART

Conventionally, an engraving board or plate is made of a single material such as wood, rubber or synthetic resin, which, however, is not necessarily an easy material to engrave, and is liable to cause contamination of a print due to drippings of colors or ink used on the board to form the print.

SUMMARY OF THE INVENTION

The principal object of the present invention is to provide a new and novel engraving board which permits the production of a print more cleanly and easily. Thus, in accordance with this invention, there is provided an engraving board which comprises a layer of a multiplicity of short fibers arranged in a high density, a layer of water-absorbing paper, the top surface of which is coated with the short fibers which are fastened thereto with a water-resistant adhesive to form the layer of short fibers, and a base layer of paper, such as gasket paper, high in water absorption degree and capable of changing color when it absorbs water, on which the water-absorbing paper layer is secured. The water-absorbing paper may be thinner than the base layer in a preferred embodiment of the invention.

The various features of novelty which characterize the invention are pointed out with particularity in the claims annexed to and forming a part of this disclosure. For a better understanding of the invention, its operating advantages and specific objects attained by its uses, reference should be had to the accompanying drawings and descriptive matter in which there are illustrated preferred embodiments of the invention.

DESCRIPTION OF THE PREFERRED EMBODIMENTS

Figure 1:
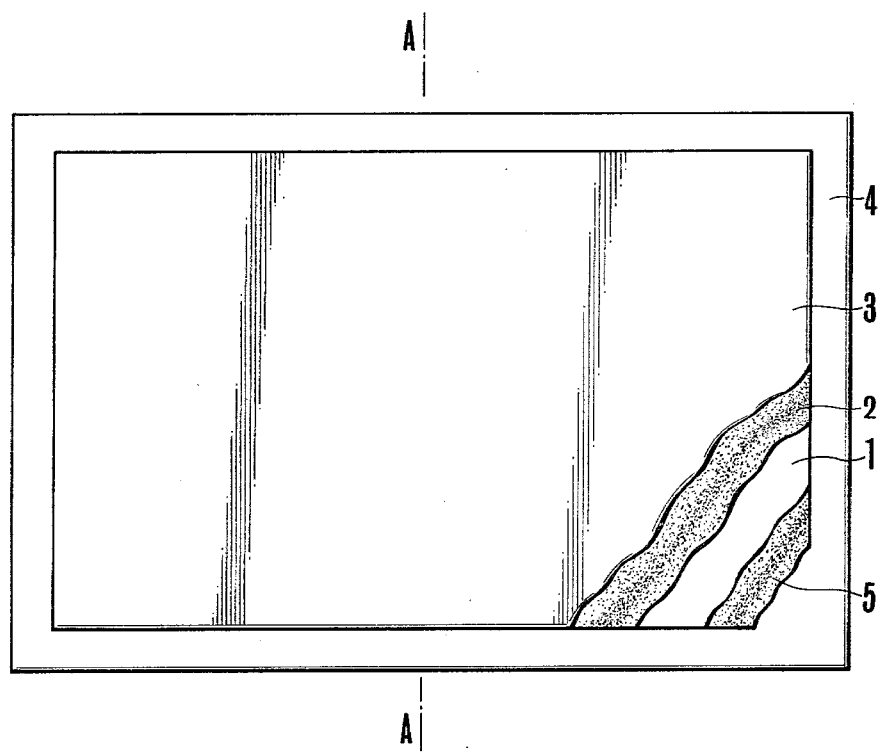
FIG. 1 is a partially cutaway plan view of the whole engraving board according to a preferred embodiment of the present invention.
Figure 2:
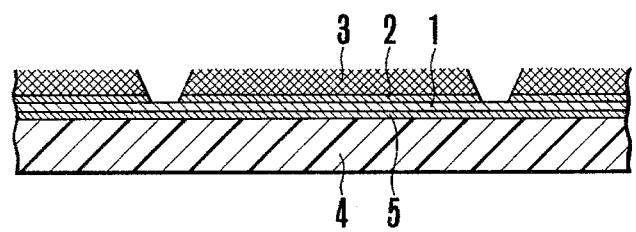
FIG. 2 is a sectional schematic view taken along the line A—A of FIG. 1.

Referring to the drawings in particular, the engraving board is composed of a layer 1 of thin, tough, and water-absorbing paper such as kraft paper. The top surface of this is coated with short fibers, such as short snythetic fibers, electrostatically and densely fastened thereto with a water-resistant adhesive 2 to form a printing layer 3 of a multiplicity of short densely arranged fibers. A layer 4 of thick and stiff paper such as gasket paper which can be larger in area than the thin paper layer 1 and a short fiber layer 3, is disposed under the thin paper layer 1 which is stuck on the thick paper layer 4 with an adhesive 5 so that the peripheral four sides of the thick paper layer 4 may be exposed in FIG. 1. The short synthetic fibers may be made of cuprammonium fibers.

The above-mentioned printing layer of short fibers can be 0.2 to 1.0 mm thick and preferably in a layer from about 0.3 to 0.6 mm thick, which approximately corresponds with the length of the fibers. Actual microscopic examination of cuprammonium fibers used, show them to be powdery in appearance and have a fiber length of about 0.2 t o 0.5 mm. A preferred density of fibers for the printing layer is about 100 grams per square meter. The layer of thin paper is from about 0.1 to 0.3 mm thick, which corresponds to the thickness of paper such as kraft paper and the layer of thick paper is preferably not less than 1.0 mm thick, which corresponds to the thickness of paper such as gasket paper. Although layer 4 is preferably thicker than layer 1, this is not absolutely necessary so that layer 4 will be termed a base layer and layer 1 will be termed a middle layer.

If necessary, a film for preventing the adhesive 2 from infiltrating into the thin paper layer 1 may be provided on the surface of the thin paper layer 1, which film is removed together with the short fibers when they are peeled off as will be described below. This film may be a lacquer sprayed on or brushed onto the thin paper layer 1.

Figure 3:
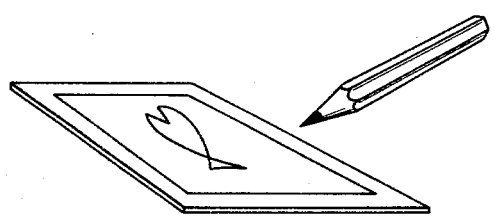
FIG. 3 is a schematic showing of a first step in using the inventive engraving board.
Figure 4:
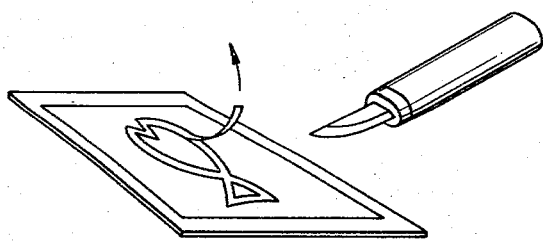
FIGS. 4, 5, 6, and 7 are subsequent steps in the use and reuse of the inventive engraving board.
Figure 5:
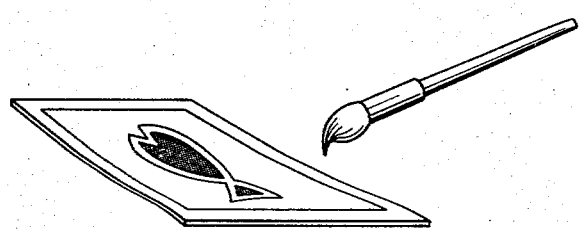
Figure 6:
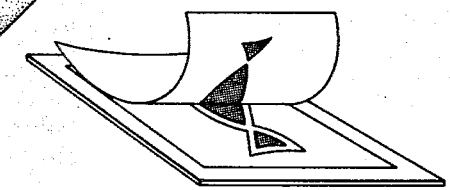
Figure 7:
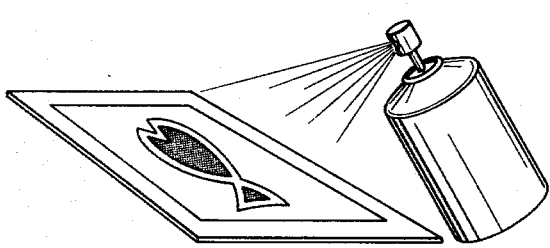

The following is the procedure for producing a print by the use of the engraving board according to the present invention with reference to FIGS. 3 to 7:

A design is first drawn on the engraving board using pencils or the like (FIG. 3). The short fibers of the layer 3 with the adhesive 2 are then peeled off along the contour of the design using contour knives, thin-bladed tools, matches or the like to expose the surface of the thin paper of layer 1 (FIG. 4). After thus exposing the desired areas of the thin paper of layer 1, water-diluted water-colors, color media or the like are laid on the areas in the conventional manner where the short fibers of the layer 3 remain (FIG. 5). A sheet of paper is then brought into contact with the upper surface of the engraving board before the colors on the fiber layer 3 have dried, and the sheet of paper is pressed from above using a rubber roller, barrel or the like (FIG. 6). In another example, the above peeling-off process may be omitted. In this case, a picture or design is drawn on the engraving board using water-colors somewhat thickly dissolved in water, and then a sheet of paper is brought into contact with the engraving board to perform the printing process in the same manner as above. If necessary, the colors laid on the engraving board may be completely dried. In this case, the entire printing surface of the engraving board is sprayed with water to properly wet and soften the colors before the printing process is performed in the same manner as above.

It will be understood from the foregoing description that the engraving board of the present invention has the following various advantages and effects:

It is as a matter of course that beautiful and clear prints can be produced in the above-mentioned process according to the present invention. In addition, the thin paper such as kraft paper coated with short fibers is water absorbent; therefore, the procedure required before the printing process is only to peel off the short fibers to expose the thin paper which can absorb drippings of colors or ink; thus the present invention can eliminate the troublesome peeling-off process of the thin paper. Moreover, the thick paper such as gasket paper which is high in water absorption, is used as the base on which the thin paper is stuck; therefore, in the printing opertion, colors or ink dripped from between the short fibers are absorbed in the thick paper through the exposed surface or area of the thin paper. Accordingly, the present invention can completely eliminate contamination of a print due to drippings of colors or ink. Furthermore, the thick paper layer used as the base is larger in area than the fiber layer and the thin paper layer, being so provided that at least a part of the periphery thereof may be exposed; therefore, the exposed area of the thick paper layer can be held by the fingers when colors are being coated on the printing surface of the engraving board, thereby preventing hands and fingers from being stained even when the printing surface is being painted throughout. Even if the colors are slightly spread out of the printing surface of the engraving board, the exposed area of the thick paper layer can absorb the split colors, thereby preventing staining of the table and others. In addition, the thick paper has the property of changing color on its own when it absorbs water. Therefore, when colors painted on the printing surface of the engraving board which have dried are sprayed with water to be again softened in preparation for the printing process, the degree of color change of the thick paper can indicate the degree of moistening of the colors due to water mist, thereby making it possible to select the proper softening condition of the colors.

The water absorbant short fibrous layer 3 thus is of a felt-like or velvet-like unwoven material. It is noted that this board is primarily to be used as an arts-and-crafts device for the general public but can also have use in commercial engraving establishments. The base or thick paper board is thus preferably made of a rigid cardboard structure which can be individually used to produce art works.

The back of the board may include graphics which show the steps of using the board for printing. A first step is the drawing of a design on the surface or short fiber layer 3 of the board. A second step is the cutting out of the design, a third step is the painting of the design with water color, for example. A fourth step may show paper being superposed on the design and patted or pressed down. The paper is lifted off the board with the imprintation in a fifth step and the surface may then be resprayed with water to "re-energize" the water color paints for a subsequent printing.

The inventive engraving board has several advantages over prior art engraving boards which include the anti-smearing feature of the invention as well as the great ease of cutting away portions of the fibrous layer 3.

In order to obtain a color print by the use of prior art engraving boards having a printing surface made of wood or resilient, or hard, rubber:

(1) several kinds of particular gravers and specific kinds of the pigments for the engraving board must be used; and (2) a plurality of boards corresponding to the kinds of colors to be used must be prepared and cut out and a plurality of separate printing processes must be successively taken to obtain a printed sheet.

(3) In addition, according to such prior art engraving boards, it is impossible or very difficult to obtain a print including gradated or shaded color tones; and further, (4) printing surface will have to be re-painted with colors every time the second, third and successive sheet of papers are printed.

In contrast to the above, according to the engraving board of the invention:

(1) a single kind of ordinary cutter may be sufficient for use to easily cut and pull away the fibrous layer and usual water colors may be used; and (2) a single board can include various kinds of colors without smearing the borders of the designs painted with different colors since the fibrous printing surface of the invention absorbs the colors, and accordingly, a sheet of complete print can be obtained by a single printing process.

(3) in addition, according to the engraving board of the invention, a print including delicately gradated or shaded color tones is obtainable; and further, (4) once the printing surface is painted with colors, a series of paintings can be performed to print a plurality of sheets of papers without re-painting the surface with colors at every repetition.

While specific embodiments of the invention have been shown and described in detail to illustrate the application of the principles of the invention, it will be understood that the invention may be embodied otherwise without departing from such principles.

What is claimed is:

1. An engraving board for printing a design with coloring media comprising,
   a base paper layer,
   a middle paper layer overlaying at least a portion of said base paper layer and secured thereto by an adhesive, and
   a water absorbent printing layer comprising a multiplicity of densely packed unwoven short fibers overlaying said middle paper layer and water-resistantly secured thereto, said printing layer can be cut to remove a portion thereof for exposing a portion of said middle paper layer and leaving a remaining portion of said printing layer in the shape of the design to be printed whereby the coloring medium is laid over the engraving board and is absorbed into the exposed portion of said middle paper layer.

2. An engraving board according to claim 1 wherein said base paper layer is thicker than said middle paper layer.

3. An engraving board according to claim 1 wherein said base paper layer and said middle paper layer both comprise water-absorbent paper and said base paper layer is made of stiff paper capable of changing color when it absorbs water.

4. An engraving board according to claim 2, wherein said thin paper layer includes a film for preventing the adhesive from infiltrating into the thin paper.

5. An engraving board according to claim 2, wherein said thin paper layer is kraft paper or the like and said thick paper layer is gasket paper or the like.

6. An engraving board according to claim 1 wherein said printing layer is secured to said middle paper layer by water-resistant adhesive.

7. An engraving board according to claim 2, wherein said printing layer is between about 0.2 to 1.0, preferably, 0.3 to 0.6 millimeters thick, said thin paper layer is from about 0.1 to 0.3 millimeters thick, said thick paper layer is not less than about 1.0 millimeters thick.

8. An engraving board according to claim 2, wherein said thick paper layer extends beyond said thin paper layer to form an exposed periphery which can be held without contact with said printing layer or said thin paper layer.

9. An engraving board according to claim 7, said printing layer being composed of unwoven cuprammonium fiber, having a fiber length of about 0.2 to 0.5 mm, density of the fibers for said printing layer being about 100 grams per square meter.

* * * * *